(12) United States Patent
Yamanaga et al.

(10) Patent No.: US 8,030,947 B2
(45) Date of Patent: Oct. 4, 2011

(54) ELECTRONIC APPARATUS NOISE MEASUREMENT METHOD

(75) Inventors: Ko Yamanaga, Nagaokayo (JP); Takahiro Azuma, Yokohama (JP)

(73) Assignee: Murata Manufacturing Co., Ltd., Nagaokakyo-shi, Kyoto-fu (JP)

( * ) Notice: Subject to any disclaimer, the term of this patent is extended or adjusted under 35 U.S.C. 154(b) by 37 days.

(21) Appl. No.: 12/580,638

(22) Filed: Oct. 16, 2009

(65) Prior Publication Data

US 2010/0026316 A1 Feb. 4, 2010

Related U.S. Application Data

(63) Continuation of application No. PCT/JP2008/059031, filed on May 16, 2008.

(30) Foreign Application Priority Data

May 23, 2007 (JP) .................................. 2007-136913

(51) Int. Cl.
G01R 23/20 (2006.01)
G01R 27/32 (2006.01)

(52) U.S. Cl. .......................... 324/613; 324/625; 324/638

(58) Field of Classification Search .................. 324/613, 324/625, 638
See application file for complete search history.

(56) References Cited

U.S. PATENT DOCUMENTS 5,495,173 A * 2/1996 Bockelman et al. .......... 324/625

FOREIGN PATENT DOCUMENTS

| JP | 06-043197 | | 2/1994 |
|---|---|---|---|
| JP | 10-502453 | A | 3/1998 |
| JP | 2000-241473 | | 9/2000 |
| JP | 2001-194435 | A | 7/2001 |
| JP | 2001194435 | * | 7/2001 |
| JP | 2002-323524 | A | 11/2002 |
| JP | 2002323524 | * | 11/2002 |
| JP | 2004-361380 | | 12/2004 |
| JP | 2005-207960 | | 8/2005 |
| WO | WO-96/01433 | A1 | 1/1996 |

OTHER PUBLICATIONS

Written Opinion of corresponding International Application No. PCT/JP2008/059031, dated Aug. 12, 2008.

* cited by examiner

*Primary Examiner* — Jeff Natalini
*Assistant Examiner* — Farhana Hoque
(74) *Attorney, Agent, or Firm* — Dickstein Shapiro LLP

(57) ABSTRACT

Second and third ports of a network analyzer are individually connected via cables to predetermined connection points on a differential transmission circuit on an object to be measured. A differential cable is connected to the differential transmission circuit. An antenna for receiving an electromagnetic wave radiated from the differential cable is connected to a first port of the network analyzer via a first cable. The network analyzer measures a three-port S parameter of the first, second, and third ports and calculates common-mode and normal-mode components of noise radiated from the differential cable. As a result, the source of noise in an electronic apparatus can be determined, and common-mode noise and normal-mode noise can be separately measured.

12 Claims, 6 Drawing Sheets

US 8,030,947 B2

ELECTRONIC APPARATUS NOISE MEASUREMENT METHOD

CROSS REFERENCE TO RELATED APPLICATIONS

The present application is a continuation of International Application No. PCT/JP2008/059031, filed May 16, 2008, which claims priority to Japanese Patent Application No. JP2007-136913, filed May 23, 2007, the entire contents of each of these applications being incorporated herein by reference in their entirety.

FIELD OF THE INVENTION

The present invention relates to a noise measurement method of measuring noise generated in an electronic apparatus.

BACKGROUND OF THE INVENTION

Patent Document 1 discloses an electronic apparatus noise measurement method for a distribution estimation apparatus for experimentally estimating the distribution of radiated emissions inside/outside the housing of an electronic apparatus.

Patent Document 2 discloses an apparatus for measuring an S parameter using a three-port network analyzer.

Patent Document 1: Japanese Unexamined Patent Application Publication No. 6-43197

Patent Document 2: Japanese Unexamined Patent Application Publication No. 2004-361380

However, an apparatus having the configuration disclosed in Patent Document 1 or 2 is not suitable for determining the source of noise on a printed circuit board provided in the housing of an electronic apparatus or separately detecting common-mode noise and normal-mode noise.

SUMMARY OF THE INVENTION

It is an object of the present invention to provide an electronic apparatus noise measurement method capable of determining the source of noise in an electronic apparatus, measuring little noise, and performing processing in accordance with a mode in which problematic noise is generated.

In order to solve the above-described problems, the present invention provides an electronic apparatus noise measurement method including: connecting to each of second and third ports of a network analyzer a connection portion (for example, a probe or a connector) to be connected to a predetermined measurement point on a circuit to be measured; connecting a cable to the circuit to be measured; connecting an antenna for receiving an electromagnetic wave radiated from the cable to a first port of the network analyzer; measuring a three-port S parameter of the first, second, and third ports using the network analyzer; and converting the three-port S parameter into a mixed-mode S parameter so as to calculate common-mode and normal-mode components of the electromagnetic wave radiated from the cable.

Furthermore, the present invention provides an electronic apparatus noise measurement method including: connecting to each of second and third ports of a network analyzer a connection portion (for example, a probe or a connector) to be connected to a predetermined measurement point on a circuit to be measured on a printed wiring board that is an object to be measured connected to a cable; connecting an antenna for receiving an electromagnetic wave radiated from the cable to a first port of the network analyzer; measuring a three-port S parameter of the first, second, and third ports using the network analyzer; and converting the three-port S parameter into a mixed-mode S parameter so as to calculate common-mode and normal-mode components of the electromagnetic wave radiated from the cable.

Still furthermore, the present invention provides an electronic apparatus noise measurement method comprising: connecting to each of second and third ports of a network analyzer a connection portion (for example, a probe or a connector) to be connected to a predetermined measurement point on a circuit to be measured on a printed wiring board that is an object to be measured; connecting an antenna for receiving an electromagnetic wave radiated from the circuit to be measured to a first port of the network analyzer; measuring a three-port S parameter of the first, second, and third ports using the network analyzer; and converting the three-port S parameter into a mixed-mode S parameter so as to calculate common-mode and normal-mode components of the electromagnetic wave radiated from the circuit to be measured.

The circuit to be measured is, for example, a differential transmission circuit formed by a conductor pattern formed on a printed wiring board, and each of the second and third ports of the network analyzer is connected to a predetermined measurement point on the differential transmission circuit.

The circuit to be measured is, for example, a single-ended signal line composed of a signal line and a ground line, and each of the second and third ports of the network analyzer is connected to predetermined measurement points on the signal line and the ground line.

The circuit to be measured is, for example, a power supply circuit composed of a power supply line and a ground line, and each of the second and third ports of the network analyzer is connected to predetermined measurement points on the power supply line and the ground line.

According to the present invention, it is possible to measure a three-port S parameter, accurately divide an electromagnetic wave radiated from a cable into a common-mode component and a normal-mode component on the basis of the three-port S parameter, and perform processing in accordance with a mode in which problematic noise is generated.

REFERENCE NUMERALS

Figure 1:
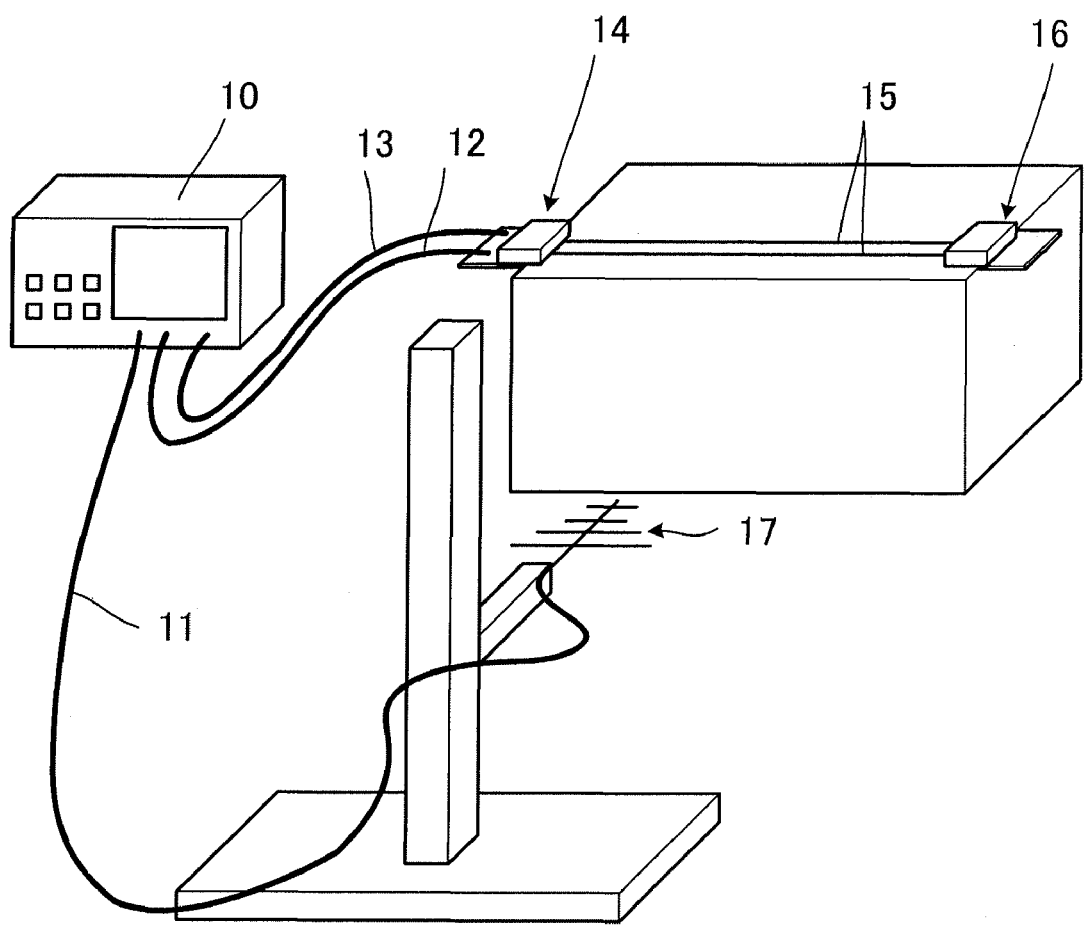
FIG. 1 is a diagram illustrating the configuration of a measurement apparatus using an electronic apparatus noise measurement method according to a first embodiment.

10 network analyzer
11 to 13 cable
14 and 18 object to be measured
15 differential cable
16 termination fixture
17 antenna
19 differential transmission circuit
20 termination apparatus
21 and 22 coaxial connector
23 printed wiring board
24 and 27 differential transmission circuit
25 common-mode choke filter
28 termination apparatus
30 printed wiring board
31 differential transmission circuit
32 ground electrode
P1 and P2 measurement point

DETAILED DESCRIPTION OF THE INVENTION

First Embodiment

FIG. 1 is a diagram illustrating a state in which an electronic apparatus noise measurement method according to the first embodiment is performed. Referring to FIG. 1, an object to be measured 14 is provided with a differential transmission circuit. This differential transmission circuit is connected to second and third ports of a network analyzer 10 via a second cable 12 and a third cable 13, respectively. The differential transmission circuit of the object to be measured 14 is connected to one end of a differential cable 15. The other end of the differential cable 15 is terminated by a termination fixture 16.

An antenna 17 is disposed at a predetermined distance from the differential cable 15. The antenna 17 is connected to a first port of the network analyzer 10 via a cable 11.

The antenna 17 is used as a reception antenna. That is, an electromagnetic wave propagates through the differential cable 15, is radiated from the differential cable 15, and is then received by the antenna 17 as a signal.

The network analyzer 10 illustrated in FIG. 1 measures an S parameter of three ports, that is, the first, second, and third ports, and calculates the common-mode and normal-mode components of noise radiated from the differential cable 15 on the basis of the S parameter using the following calculation method.

Figure 2A:
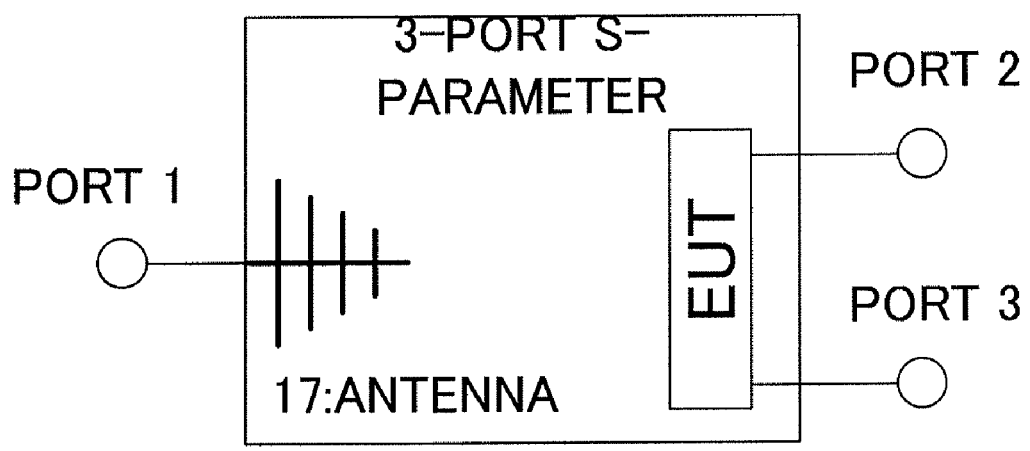
FIGS. 2A and 2B are diagrams illustrating the relationship among ports used for mode conversion.

FIG. 2A illustrates the relationship among ports in an S parameter prior to mode conversion. Referring to FIG. 2A, EUT represents an apparatus to be measured. If waves that enter ports 1, 2, and 3 are represented by a1, a2, and a3 and waves that are reflected from the ports 1, 2, and 3 are represented by b1, b2, and b3, the following equation (1) is satisfied.

[Equation 1]

$$\begin{bmatrix} b_1 \\ b_2 \\ b_3 \end{bmatrix} = \begin{bmatrix} S_{11} & S_{12} & S_{13} \\ S_{21} & S_{22} & S_{23} \\ S_{31} & S_{32} & S_{33} \end{bmatrix} \begin{bmatrix} a_1 \\ a_2 \\ a_3 \end{bmatrix} \quad (1)$$

Figure 2B:
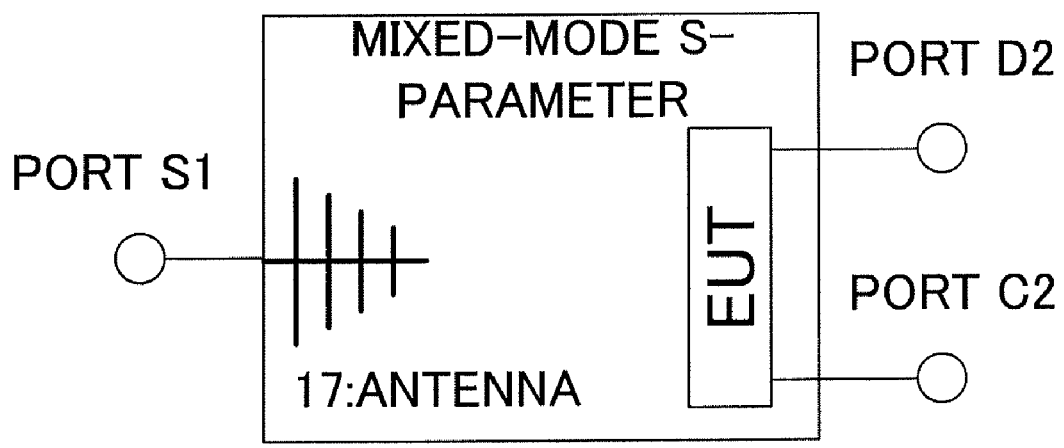

FIG. 2B illustrates the relationships among the ports in an S parameter subsequent to mode conversion to a mixed mode. As illustrated in the drawing, if the port of an antenna is not changed, the representation of the port of the antenna is changed from the port 1 to a port S1, the ports of the EUT are changed to normal-mode and common-mode ports, and the representations of the ports of the EUT are changed from the ports 2 and 3 to ports d2 and c2, respectively, the following equations (2) and (3) are satisfied.

[Equation 2]

$$\begin{bmatrix} b_{s1} \\ b_{c2} \\ b_{d2} \end{bmatrix} = \begin{bmatrix} b_1 \\ \frac{1}{\sqrt{2}}(b_2 + b_3) \\ \frac{1}{\sqrt{2}}(b_2 - b_3) \end{bmatrix}, \begin{bmatrix} a_{s1} \\ a_{c2} \\ a_{d2} \end{bmatrix} = \begin{bmatrix} a_1 \\ \frac{1}{\sqrt{2}}(a_2 + a_3) \\ \frac{1}{\sqrt{2}}(a_2 - a_3) \end{bmatrix} \quad (2)$$

[Equation 3]

$$\begin{bmatrix} b_{s1} \\ b_{c2} \\ b_{d2} \end{bmatrix} = \begin{bmatrix} S_{ss11} & S_{sc12} & S_{sd12} \\ S_{cs21} & S_{cc22} & S_{cd22} \\ S_{ds21} & S_{dc22} & S_{dd22} \end{bmatrix} \begin{bmatrix} a_{s1} \\ a_{c2} \\ a_{d2} \end{bmatrix} \quad (3)$$

In the above-described equation, $S_{sd12}$ represents a ratio of energy output from the antenna when a normal-mode signal is input into the EUT, and $S_{sc12}$ represents a ratio of energy when a common-mode signal is input into the EUT. The following equation (4) is equation obtained by changing equation (2).

[Equation 4]

$$\begin{bmatrix} a_{s1} \\ a_{c2} \\ a_{d2} \end{bmatrix} = \begin{bmatrix} a_1 \\ \frac{1}{\sqrt{2}}(a_2 + a_3) \\ \frac{1}{\sqrt{2}}(a_2 - a_3) \end{bmatrix} = \begin{bmatrix} 1 & 0 & 0 \\ 0 & \frac{1}{\sqrt{2}} & \frac{1}{\sqrt{2}} \\ 0 & \frac{1}{\sqrt{2}} & -\frac{1}{\sqrt{2}} \end{bmatrix} \begin{bmatrix} a_1 \\ a_2 \\ a_3 \end{bmatrix} \quad (4)$$

$$\begin{bmatrix} b_{s1} \\ b_{c2} \\ b_{d2} \end{bmatrix} = \begin{bmatrix} b_1 \\ \frac{1}{\sqrt{2}}(b_2 + b_3) \\ \frac{1}{\sqrt{2}}(b_2 - b_3) \end{bmatrix} = \begin{bmatrix} 1 & 0 & 0 \\ 0 & \frac{1}{\sqrt{2}} & \frac{1}{\sqrt{2}} \\ 0 & \frac{1}{\sqrt{2}} & -\frac{1}{\sqrt{2}} \end{bmatrix} \begin{bmatrix} b_1 \\ b_2 \\ b_3 \end{bmatrix}$$

Here, it is assumed equation (5) is set up.

[Equation 5]

$$U = \begin{bmatrix} 1 & 0 & 0 \\ 0 & \frac{1}{\sqrt{2}} & \frac{1}{\sqrt{2}} \\ 0 & \frac{1}{\sqrt{2}} & -\frac{1}{\sqrt{2}} \end{bmatrix} \quad (5)$$

Then, the following equation (6) is satisfied.

[Equation 6]

$$\begin{bmatrix} a_1 \\ a_2 \\ a_3 \end{bmatrix} = U^{-1} \begin{bmatrix} a_{s1} \\ a_{c2} \\ a_{d2} \end{bmatrix}, \begin{bmatrix} b_1 \\ b_2 \\ b_3 \end{bmatrix} = U^{-1} \begin{bmatrix} b_{s1} \\ b_{c2} \\ b_{d2} \end{bmatrix} \quad (6)$$

$$U^{-1} \begin{bmatrix} b_{s1} \\ b_{c2} \\ b_{d2} \end{bmatrix} = \begin{bmatrix} S_{11} & S_{12} & S_{13} \\ S_{21} & S_{22} & S_{23} \\ S_{31} & S_{32} & S_{33} \end{bmatrix} U^{-1} \begin{bmatrix} a_{s1} \\ a_{c2} \\ a_{d2} \end{bmatrix}$$

Accordingly, equation (7) can be obtained.

[Equation 7]

$$\begin{bmatrix} b_{s1} \\ b_{c2} \\ b_{d2} \end{bmatrix} = U \begin{bmatrix} S_{11} & S_{12} & S_{13} \\ S_{21} & S_{22} & S_{23} \\ S_{31} & S_{32} & S_{33} \end{bmatrix} U^{-1} \begin{bmatrix} a_{s1} \\ a_{c2} \\ a_{d2} \end{bmatrix} \quad (7)$$

Here, a mixed-mode S parameter is defined using the following equation (8).

[Equation 8]

$$\begin{bmatrix} S_{ss11} & S_{sc12} & S_{sd12} \\ S_{cs21} & S_{cc22} & S_{cd22} \\ S_{ds21} & S_{dc22} & S_{dd22} \end{bmatrix} = U \begin{bmatrix} S_{11} & S_{12} & S_{13} \\ S_{21} & S_{22} & S_{23} \\ S_{31} & S_{32} & S_{33} \end{bmatrix} U^{-1} \quad (8)$$

In the above-described equations, U represents a symmetric orthogonal matrix. Accordingly, if calculation is performed in consideration of $U = U^{-1}$, the following equation (9) is satisfied.

[Equation 9]

$$\begin{bmatrix} S_{ss11} & S_{sc12} & S_{sd12} \\ S_{cs21} & S_{cc22} & S_{cd22} \\ S_{ds21} & S_{dc22} & S_{dd22} \end{bmatrix} = \quad (9)$$

$$\begin{bmatrix} S_{11} & \frac{1}{\sqrt{2}}(S_{12}+S_{13}) & \frac{1}{\sqrt{2}}(S_{12}-S_{13}) \\ \frac{1}{\sqrt{2}}(S_{21}+S_{31}) & \frac{1}{2}(S_{22}+S_{33}+S_{23}+S_{32}) & \frac{1}{2}(S_{22}-S_{33}-S_{23}+S_{32}) \\ \frac{1}{\sqrt{2}}(S_{21}-S_{31}) & \frac{1}{2}(S_{22}-S_{33}+S_{23}-S_{32}) & \frac{1}{2}(S_{22}+S_{33}-S_{23}-S_{32}) \end{bmatrix}$$

Thus, the incident waves a1, a2, and a3 and the reflecting waves b1, b2, and b3, which are included in equation (1), are measured, and $S_{sc12}$ and $S_{sd12}$ are calculated on the basis of the measurement results.

Figure 3:
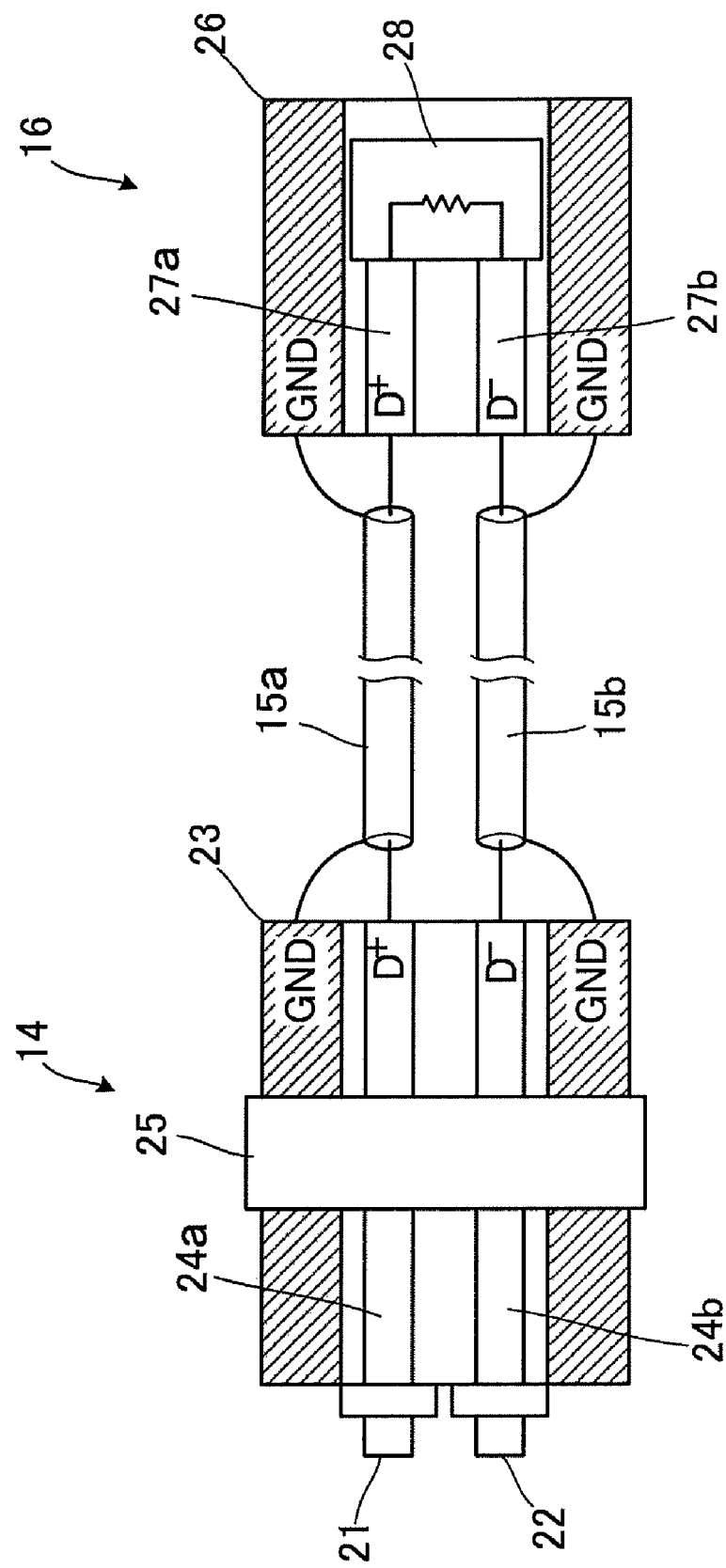
FIG. 3 is a diagram illustrating the connection relationship between an object to be measured and a differential cable.

FIG. 3 is a diagram illustrating a concrete example of an object to be measured in the measurement system illustrated in FIG. 1. The object to be measured 14 is provided with a common-mode choke filter 25 on a printed wiring board 23 on which differential transmission circuits 24a and 24b and a ground electrode GND are formed. The printed wiring board 23 is provided with coaxial connectors 21 and 22 that are connected to the cables 12 and 13 illustrated in FIG. 1. Central conductors of the coaxial connectors 21 and 22 are connected to the differential transmission circuits 24a and 24b, respectively, and outer conductors of the coaxial connectors 21 and 22 are connected to the ground electrode GND.

A termination fixture 16 is obtained by forming a termination apparatus 28 on a printed wiring board 26 on which differential transmission circuits 27a and 27b and the ground electrode GND are formed. One ends of differential cables 15a and 15b are connected to the differential transmission circuits of the object to be measured 14 and the ground electrode, and the other ends of the differential cables 15a and 15b are connected to the differential transmission circuits of the termination fixture 16 and the ground electrode.

In this embodiment, the differential cable is not a part of the object to be measured. In this case, any type of cable can be used as the differential cable, but it is desirable that a single-shielded line be used as the differential cable so as to allow the differential cable to easily radiate noise.

Figure 4A:
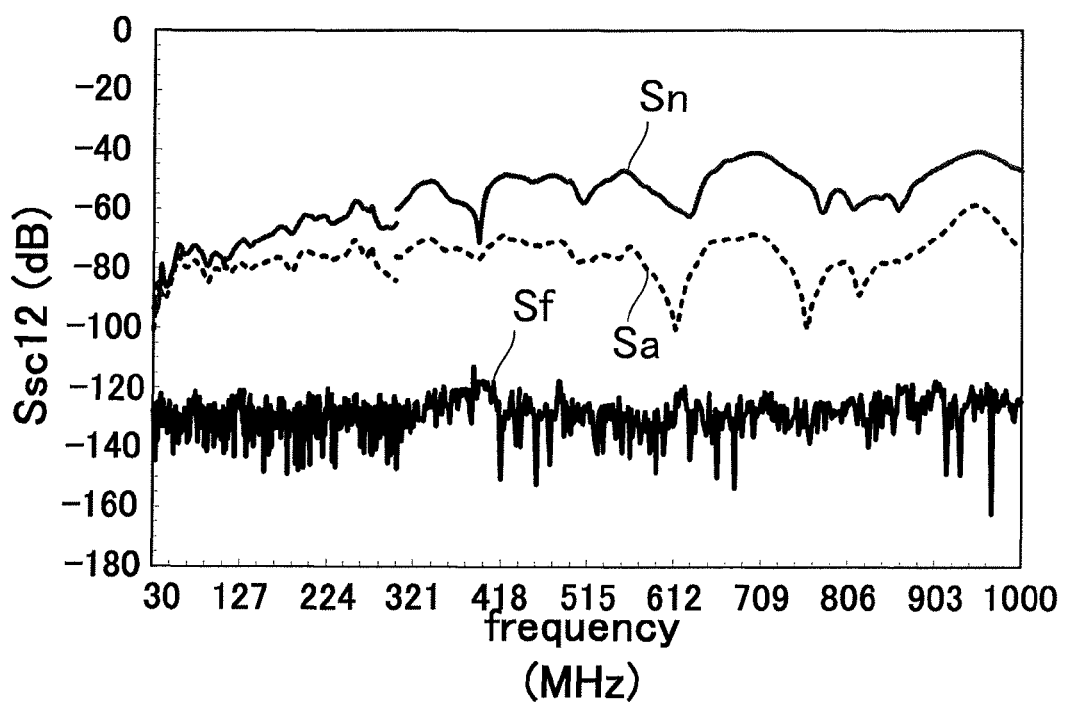
FIGS. 4A and 4B are diagrams illustrating measurement results of energy received when a radiated common-mode signal is input.
Figure 4B:
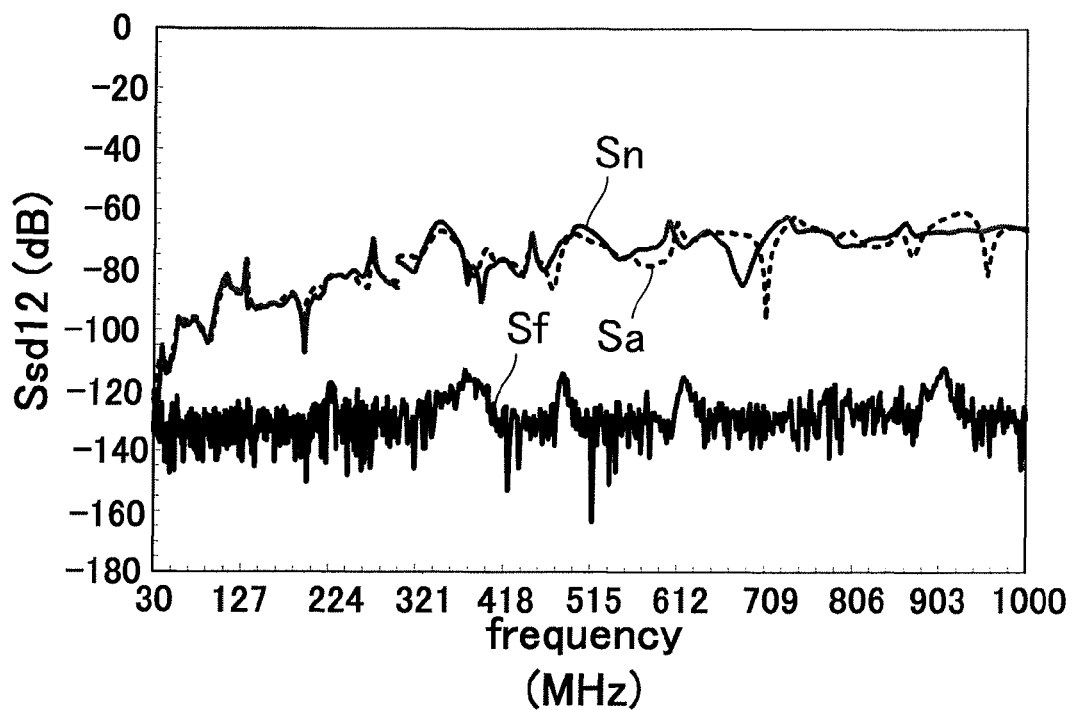

FIG. 4A and FIG. 4B illustrate measurement results of common-mode energy and normal-mode energy which are obtained by measurement with the object to be measured including the common-mode choke filter 25 illustrated in FIG. 3 and measurement with the object to be measured including no common-mode choke filter 25. Sf represents an energy floor level (background noise level), Sa represents energy obtained when the common-mode choke filter 25 is used, Sn represents energy obtained when the common-mode choke filter 25 is not used. FIG. 4A illustrates the characteristic of energy $S_{sc12}$ that is received by an antenna when a common-mode energy is input into an evaluation system, and FIG. 4B illustrates the characteristic of energy $S_{sd12}$ that is received by the antenna when a normal-mode energy is input into the evaluation system.

Thus, the normal-mode energy $S_{sd12}$ is not changed irrespective of the presence of the common-mode choke filter 25 as illustrated in FIG. 4B. On the other hand, the common-mode energy $S_{sc12}$ is significantly changed in accordance with the presence of the common-mode choke filter 25 as illustrated in FIG. 4A. It is apparent from these facts that the radiation characteristics of the common mode and the normal mode can be accurately measured using the measurement apparatus and the measurement method which have been described with reference to FIGS. 1 and 3. The object to be measured illustrated in FIG. 3 is also used to verify the correctness of this measurement method.

Second Embodiment

Figure 5:
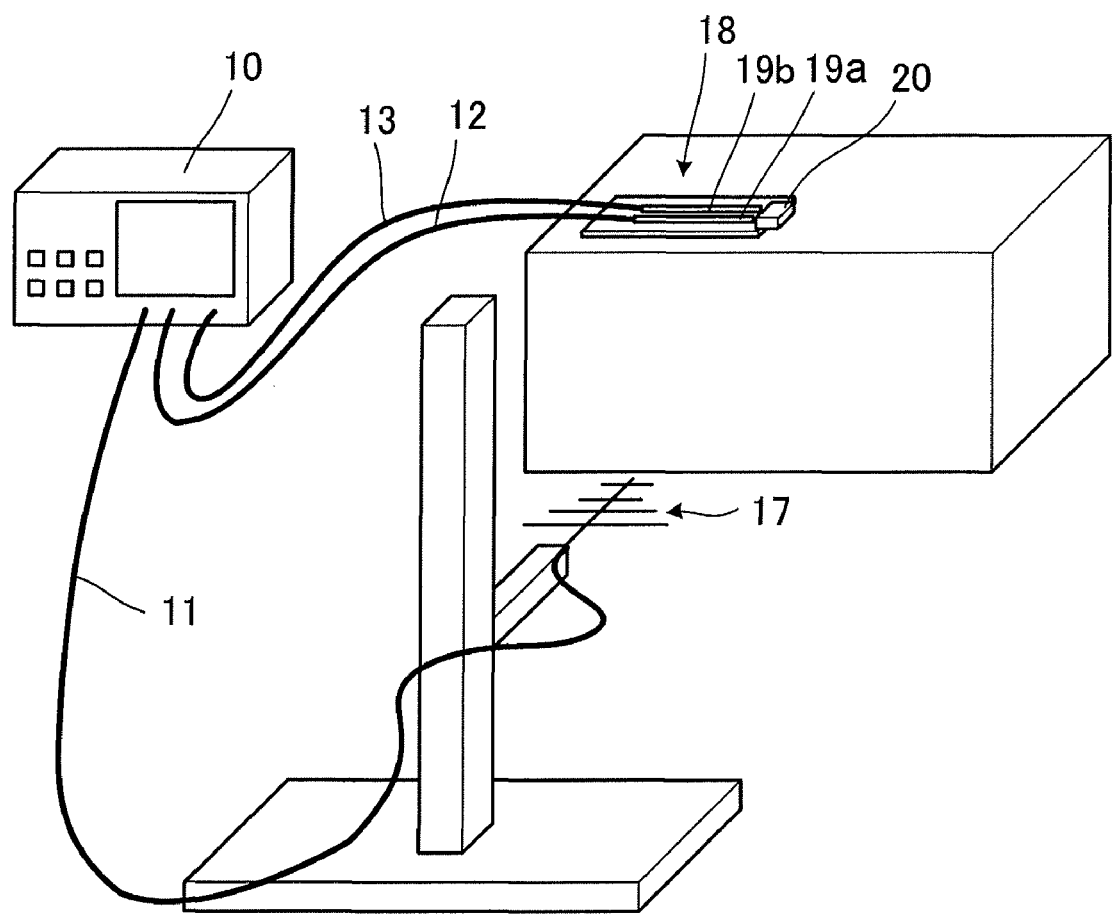
FIG. 5 is a diagram illustrating the configuration of a measurement apparatus using an electronic apparatus noise measurement method according a second embodiment.

FIG. 5 is a diagram illustrating the configuration of a measurement apparatus using an electronic apparatus noise measurement method according to the second embodiment. The difference between FIGS. 1 and 5 is the configuration of an object to be measured. Referring to FIG. 5, an object to be measured 18 includes differential transmission circuits 19a and 19b which are formed on a printed wiring board as a parallel conductor pattern. Respective ends of the differential transmission circuits 19a and 19b are terminated by a termination apparatus 20. The other ends of the differential transmission circuits 19a and 19b are connected to the network analyzer 10 via the cables 12 and 13, respectively.

Thus, if the differential transmission circuits 19a and 19b have a relatively long length, the antenna 17 receives electromagnetic waves radiated from the differential transmission circuits 19a and 19b without the differential cable 15 illustrated in FIG. 1. The network analyzer 10 performs computation similar to that described previously in the first embodiment.

Third Embodiment

Figure 6:
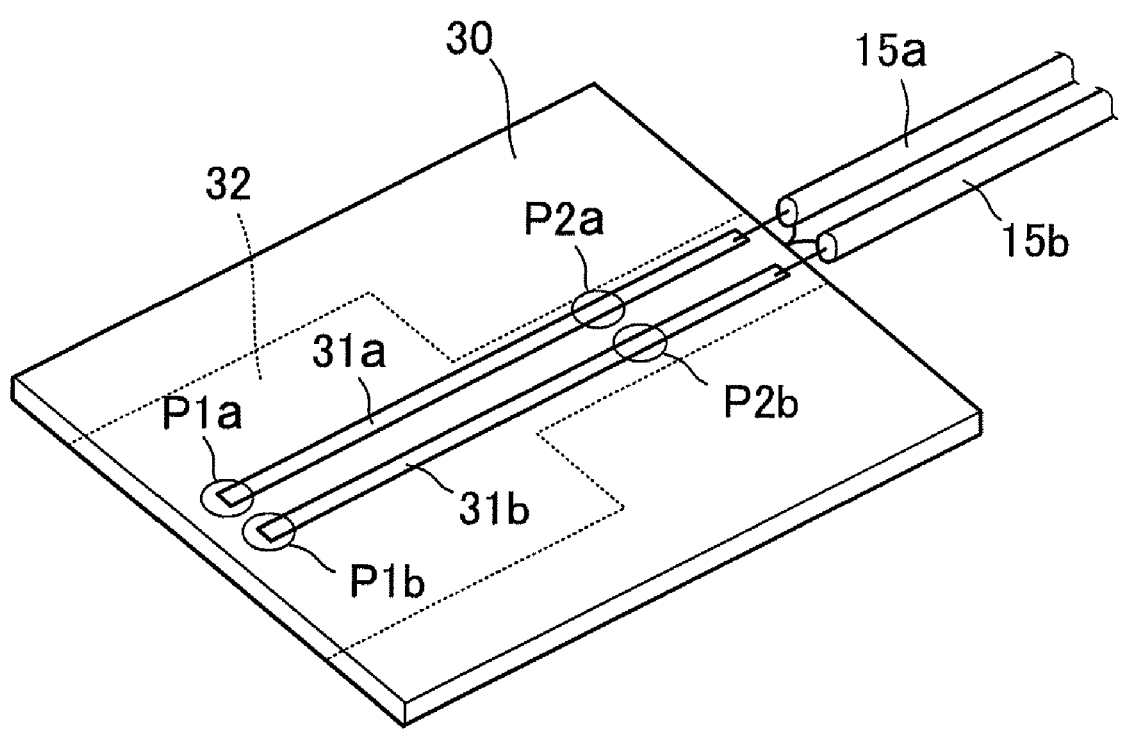
FIG. 6 is a diagram illustrating the configuration of an object to be measured using an electronic apparatus noise measurement method according to a third embodiment.

FIG. 6 is a perspective view illustrating the configuration of an object to be measured using an electronic apparatus noise measurement method according to the third embodiment. Referring to FIG. 6, a printed wiring board 30 is an object to be measured. On the printed wiring board 30, differential transmission circuits 31a and 31b are formed. Under the differential transmission circuits 31a and 31b, a ground electrode 32 is formed via an insulating layer (dielectric layer). In this example, the width of the ground electrode 32 disposed along the differential transmission circuits 31a and 31b is not constant. The differential transmission circuits 31a and 31b are connected to the differential cables 15a and 15b, respectively.

In the examples illustrated in FIGS. 1 and 5, the cables 12 and 13 connected to the network analyzer 10 are directly connected to the object to be measured. In the example illustrated in FIG. 6, since there are a plurality of measurement points of the object to be measured, probes are attached to leading ends of cables connected to a network analyzer and the leading ends of the probes are brought into contact with a measurement point (P1a, P1b) or (P2a, P2b). In order to detect the source of common-mode noise, measurement results obtained at the two measurement points are compared with each other. For example, if the common-mode level at the measurement point (P1a, P1b) is higher than that at the measurement point (P2a, P2b), it can be estimated that the common-mode noise occurs in a discontinuous area in which the width of the ground electrode 32 is changed.

Connections between the differential cables 15a and 15b illustrated in FIG. 6 and the printed wiring board 30 are not limited to when measurement is performed. If the differential cables 15a and 15b are required in an electronic apparatus, the whole of the electronic apparatus including the printed wiring board 30 and the differential cables 15a and 15b is to be measured.

In the above-described embodiments, a differential transmission circuit or a differential transmission circuit connected to a differential cable is used as an example of a circuit to be measured. Instead of such a differential transmission circuit, a single-ended signal line composed of a signal line and a ground line may be used as a circuit to be measured. In that case, the single-ended signal line is connected to a single-ended cable, the second and third ports of the above-described network analyzer are individually connected to predetermined measurement points on the signal line and the ground line, and the common-mode component and normal-mode component of noise radiated from the above-described cable are measured using a method similar to that described previously in each of the above-described embodiments. Furthermore, a power supply circuit may be used as a circuit to be measured. In that case, a single-ended cable is connected to a power supply line and a ground line of the power supply circuit, the second and third ports of the above-described network analyzer are individually connected to predetermined measurement points on the power supply line and the ground line, and the common-mode component and normal-mode component of noise radiated from the above-described cable are measured using a method similar to that described previously in each of the above-described embodiments.

The invention claimed is:

1. An electronic apparatus noise measurement method comprising:
connecting each of second and third ports of a network analyzer to a connection portion which is configured to be connected to a predetermined measurement point on a circuit to be measured;
connecting a cable to the circuit to be measured;
connecting an antenna for receiving an electromagnetic wave radiated from the cable to a first port of the network analyzer;
measuring a three-port S parameter of the first, second, and third ports using the network analyzer, the three-port S parameter being expressed by an equation (1) when waves that enter the first, second and third ports are respectively represented by a1, a2 and a3 and waves that are reflected from the first, second and third ports are respectively represented by b1, b2 and b3;

$$\begin{bmatrix} b_1 \\ b_2 \\ b_3 \end{bmatrix} = \begin{bmatrix} S_{11} & S_{12} & S_{13} \\ S_{21} & S_{22} & S_{23} \\ S_{31} & S_{32} & S_{33} \end{bmatrix} \begin{bmatrix} a_1 \\ a_2 \\ a_3 \end{bmatrix} \quad (1)$$

converting the three-port S parameter into a mixed-mode S parameter expressed by equations (2) and (3); and $$\begin{bmatrix} b_{s1} \\ b_{c2} \\ b_{d2} \end{bmatrix} = \begin{bmatrix} b_1 \\ \frac{1}{\sqrt{2}}(b_2 + b_3) \\ \frac{1}{\sqrt{2}}(b_2 - b_3) \end{bmatrix}, \begin{bmatrix} a_{s1} \\ a_{c2} \\ a_{d2} \end{bmatrix} = \begin{bmatrix} a_{s1} \\ \frac{1}{\sqrt{2}}(a_2 + a_3) \\ \frac{1}{\sqrt{2}}(a_2 - a_3) \end{bmatrix} \quad (2)$$

$$\begin{bmatrix} b_{s1} \\ b_{c2} \\ b_{d2} \end{bmatrix} = \begin{bmatrix} S_{ss11} & S_{sc12} & S_{sd12} \\ S_{cs21} & S_{cc22} & S_{cd22} \\ S_{ds21} & S_{dc22} & S_{dd22} \end{bmatrix} \begin{bmatrix} a_{s1} \\ a_{c2} \\ a_{d2} \end{bmatrix} \quad (3)$$

calculating common-mode and normal-mode components of the electromagnetic wave radiated from the cable by calculating a common-mode component of $S_{sc12}$ of the equation (3) by $(S_{12}+S_{13})/\sqrt{2}$ and calculating a normal mode component of $S_{sd12}$ by $(S_{12}-S_{13})/\sqrt{2}$.

2. The electronic apparatus noise measurement method according to claim 1, wherein the circuit to be measured is a differential transmission circuit, and the measurement point is a predetermined point on the differential transmission circuit.

3. The electronic apparatus noise measurement method according to claim 1, wherein the circuit to be measured is a single-ended signal line composed of a signal line and a ground line, and the measurement point is a predetermined point on each of the signal line and the ground line.

4. The electronic apparatus noise measurement method according to claim 1, wherein the circuit to be measured is a power supply circuit composed of a power supply line and a ground line, and the measurement point is a predetermined point on each of the power supply line and the ground line.

5. An electronic apparatus noise measurement method comprising:
connecting each of second and third ports of a network analyzer to a connection portion which is configured to be connected to a predetermined measurement point on a circuit to be measured on a printed wiring board that is an object to be measured connected to a cable;
connecting an antenna for receiving an electromagnetic wave radiated from the cable to a first port of the network analyzer;
measuring a three-port S parameter of the first, second, and third ports using the network analyzer, the three-port S parameter being expressed by an equation (1) when waves that enter the first, second and third ports are respectively represented by a1, a2 and a3 and waves that are reflected from the first, second and third ports are respectively represented by b1, b2 and b3;

$$\begin{bmatrix} b_1 \\ b_2 \\ b_3 \end{bmatrix} = \begin{bmatrix} S_{11} & S_{12} & S_{13} \\ S_{21} & S_{22} & S_{23} \\ S_{31} & S_{32} & S_{33} \end{bmatrix} \begin{bmatrix} a_1 \\ a_2 \\ a_3 \end{bmatrix} \quad (1)$$

converting the three-port S parameter into a mixed-mode S parameter expressed by equations (2) and (3); and $$\begin{bmatrix} b_{s1} \\ b_{c2} \\ b_{d2} \end{bmatrix} = \begin{bmatrix} b_1 \\ \frac{1}{\sqrt{2}}(b_2 + b_3) \\ \frac{1}{\sqrt{2}}(b_2 - b_3) \end{bmatrix}, \begin{bmatrix} a_{s1} \\ a_{c2} \\ a_{d2} \end{bmatrix} = \begin{bmatrix} a_{s1} \\ \frac{1}{\sqrt{2}}(a_2 + a_3) \\ \frac{1}{\sqrt{2}}(a_2 - a_3) \end{bmatrix} \quad (2)$$

$$\begin{bmatrix} b_{s1} \\ b_{c2} \\ b_{d2} \end{bmatrix} = \begin{bmatrix} S_{ss11} & S_{sc12} & S_{sd12} \\ S_{cs21} & S_{cc22} & S_{cd22} \\ S_{ds21} & S_{dc22} & S_{dd22} \end{bmatrix} \begin{bmatrix} a_{s1} \\ a_{c2} \\ a_{d2} \end{bmatrix} \quad (3)$$

calculating common-mode and normal-mode components of the electromagnetic wave radiated from the cable by calculating a common-mode component of $S_{sc12}$ of the equation (3) by $(S_{12}+S_{13})/\sqrt{2}$ and calculating a normal mode component of $S_{sd12}$ by $(S_{12}-S_{13})/\sqrt{2}$.

6. The electronic apparatus noise measurement method according to claim 5, wherein the circuit to be measured is a differential transmission circuit, and the measurement point is a predetermined point on the differential transmission circuit.

7. The electronic apparatus noise measurement method according to claim 5, wherein the circuit to be measured is a single-ended signal line composed of a signal line and a ground line, and the measurement point is a predetermined point on each of the signal line and the ground line.

8. The electronic apparatus noise measurement method according to claim 5, wherein the circuit to be measured is a power supply circuit composed of a power supply line and a ground line, and the measurement point is a predetermined point on each of the power supply line and the ground line.

9. An electronic apparatus noise measurement method comprising:
connecting each of second and third ports of a network analyzer to a connection portion which is configured to be connected to a predetermined measurement point on a circuit to be measured on a printed wiring board that is an object to be measured;
connecting an antenna for receiving an electromagnetic wave radiated from the circuit to be measured to a first port of the network analyzer;
measuring a three-port S parameter of the first, second, and third ports using the network analyzer, the three-port S parameter being expressed by an equation (1) when waves that enter the first, second and third ports are respectively represented by a1, a2 and a3 and waves that are reflected from the first, second and third ports are respectively represented by b1, b2 and b3;

$$\begin{bmatrix} b_1 \\ b_2 \\ b_3 \end{bmatrix} = \begin{bmatrix} S_{11} & S_{12} & S_{13} \\ S_{21} & S_{22} & S_{23} \\ S_{31} & S_{32} & S_{33} \end{bmatrix} \begin{bmatrix} a_1 \\ a_2 \\ a_3 \end{bmatrix} \quad (1)$$

converting the three-port S parameter into a mixed-mode S parameter expressed by equations (2) and (3); and $$\begin{bmatrix} b_{s1} \\ b_{c2} \\ b_{d2} \end{bmatrix} = \begin{bmatrix} b_1 \\ \frac{1}{\sqrt{2}}(b_2 + b_3) \\ \frac{1}{\sqrt{2}}(b_2 - b_3) \end{bmatrix}, \begin{bmatrix} a_{s1} \\ a_{c2} \\ a_{d2} \end{bmatrix} = \begin{bmatrix} a_{s1} \\ \frac{1}{\sqrt{2}}(a_2 + a_3) \\ \frac{1}{\sqrt{2}}(a_2 - a_3) \end{bmatrix} \quad (2)$$

$$\begin{bmatrix} b_{s1} \\ b_{c2} \\ b_{d2} \end{bmatrix} = \begin{bmatrix} S_{ss11} & S_{sc12} & S_{sd12} \\ S_{cs21} & S_{cc22} & S_{cd22} \\ S_{ds21} & S_{dc22} & S_{dd22} \end{bmatrix} \begin{bmatrix} a_{s1} \\ a_{c2} \\ a_{d2} \end{bmatrix} \quad (3)$$

calculating common-mode and normal-mode components of the electromagnetic wave radiated from the circuit to be measured by calculating a common-mode component of $S_{sc12}$ of the equation (3) by $(S_{12}+S_{13})/\sqrt{2}$ and calculating a normal mode component of $S_{sd12}$ by $(S_{12}-S_{13})/\sqrt{2}$.

10. The electronic apparatus noise measurement method according to claim 9, wherein the circuit to be measured is a differential transmission circuit, and the measurement point is a predetermined point on the differential transmission circuit.

11. The electronic apparatus noise measurement method according to claim 9, wherein the circuit to be measured is a single-ended signal line composed of a signal line and a ground line, and the measurement point is a predetermined point on each of the signal line and the ground line.

12. The electronic apparatus noise measurement method according to claim 9, wherein the circuit to be measured is a power supply circuit composed of a power supply line and a ground line, and the measurement point is a predetermined point on each of the power supply line and the ground line.

* * * * *